United States Patent [19]
Burel

[11] Patent Number: 5,313,534
[45] Date of Patent: May 17, 1994

[54] IMAGE COMPRESSION METHOD
[75] Inventor: Gilles Burel, Rennes, France
[73] Assignee: Thomson-CSF, Puteaux, France
[21] Appl. No.: 936,199
[22] Filed: Aug. 25, 1992
[30] Foreign Application Priority Data
  Sep. 20, 1991 [FR] France ............................. 91 11609
[51] Int. Cl.$^5$ ............................................ G06K 9/00
[52] U.S. Cl. ..................................... 382/56; 358/433
[58] Field of Search .................. 382/56, 34; 358/433
[56] References Cited

U.S. PATENT DOCUMENTS
3,980,809  9/1976  Cook ............................ 358/433
4,797,739  1/1989  Tanaka ........................ 358/433
5,048,112  9/1991  Alves et al. ................. 358/433

FOREIGN PATENT DOCUMENTS
0280313  8/1988  European Pat. Off. .
2179166  9/1990  Japan .

OTHER PUBLICATIONS
H. M. Jung et al, "Adaptive Vector Quantization Based Upon . . . Sequence Coding", Trans. of Inst. of Electronis, Inf. & Comm. Engineers, vol. 73, No. 9 Sep. 1990 pp. 1493–1502.
J. A. Kangas et al, "Variants of Self-Or-anizing Maps", IEEE Trans. on Neural Networks, vol. 1, No. 1, Mar. 1990, pp. 93–99.
Y. Linde et al, "An Algorithm for Vector Quantizer Design", IEEE Trans. on Comm., vol. COM28, No. 1 Jan. 1990, pp. 84–95.
N. Nasrabadi et al, "Image Coding Using Vector Quantization: A Review", IEEE Trans. on Comm ., vol. 36, No. 8 Aug. 1988, N.Y. pp. 957–971.

Primary Examiner—Leo H. Boudreau
Attorney, Agent, or Firm—Meltzer, Lippe, Goldstein, Schlissel & Sazer

[57] ABSTRACT
A method for the compression of images comprises two steps. A first step of vector quantization compresses a source image into an image of indices that is coherent in relation to the source image. A second step again compresses this image of the indices according to a prediction method using a network of multilayer neurons. Application: compression of images for their storage and transmission.

3 Claims, 3 Drawing Sheets

IMAGE COMPRESSION METHOD

BACKGROUND OF THE INVENTION

The present invention relates to a method for the compression of images. It can be applied notably in the fields of the transmission or storage of images.

The compression of images consists in reducing the quantity of data elements needed to represent an image. Vector quantization, explained in the article by R. M. GRAY,"Vector Quantization", published in the IEEE journal, *ASSP Magazine*, Apr. 1984, is a method of image compression that has been widely used. This method consists in cutting up the image into blocks and in replacing each block by an index. This index relates to a dictionary containing a limited number of representative blocks. The dictionary is constituted according to the k-means algorithm developed in the article by J. MacQueen, "Some Methods For Classification And Analysis Of Multivariate Observations" published in the catalog, *5th Berkeley Symposium On Mathematics, Statistics And Probabilities*, 1967, or according to the LBG algorithm explained in the article by Y. LINDE, A. BUZO, and R. M. GRAY, "An Algorithm For Vector Quantizer Design" in the IEEE journal, *Communications*, Jan. 1980.

The utility of the compression is nevertheless obvious when images have to be transmitted or stored. Nevertheless, the above-mentioned methods still have mediocre compression rates, and it is not always possible to achieve any significant reduction in the quantity of data elements needed to represent the image and, at the same time, preserve high quality in this image. These low compression rates lead to problems of memory space in the storage systems or of space requirement in the transmission lines, the passbands of which cannot be extended.

SUMMARY OF THE INVENTION

The aim of the invention is to overcome the above-mentioned drawbacks. To this effect, an object of the invention is a method for the compression of images comprising a first step of vector quantization wherein an image source is cut up into blocks, each block being compared with the elements of a dictionary with a view to its replacement by the index of the element of the dictionary that is closest to it, so as to obtain an image that is compressed and coherent in relation to the source image, wherein this first step is followed by a second step for the compression of the compressed image according to a method of prediction.

The main advantage of the invention is that it enables the compression rate of the image to be improved without any loss of quality of this image.

BRIEF DESCRIPTION OF THE DRAWINGS

Other features and advantages of the invention will appear from the following description, made with reference to the appended drawings, of which.

DESCRIPTION OF THE INVENTION

Figure 1:
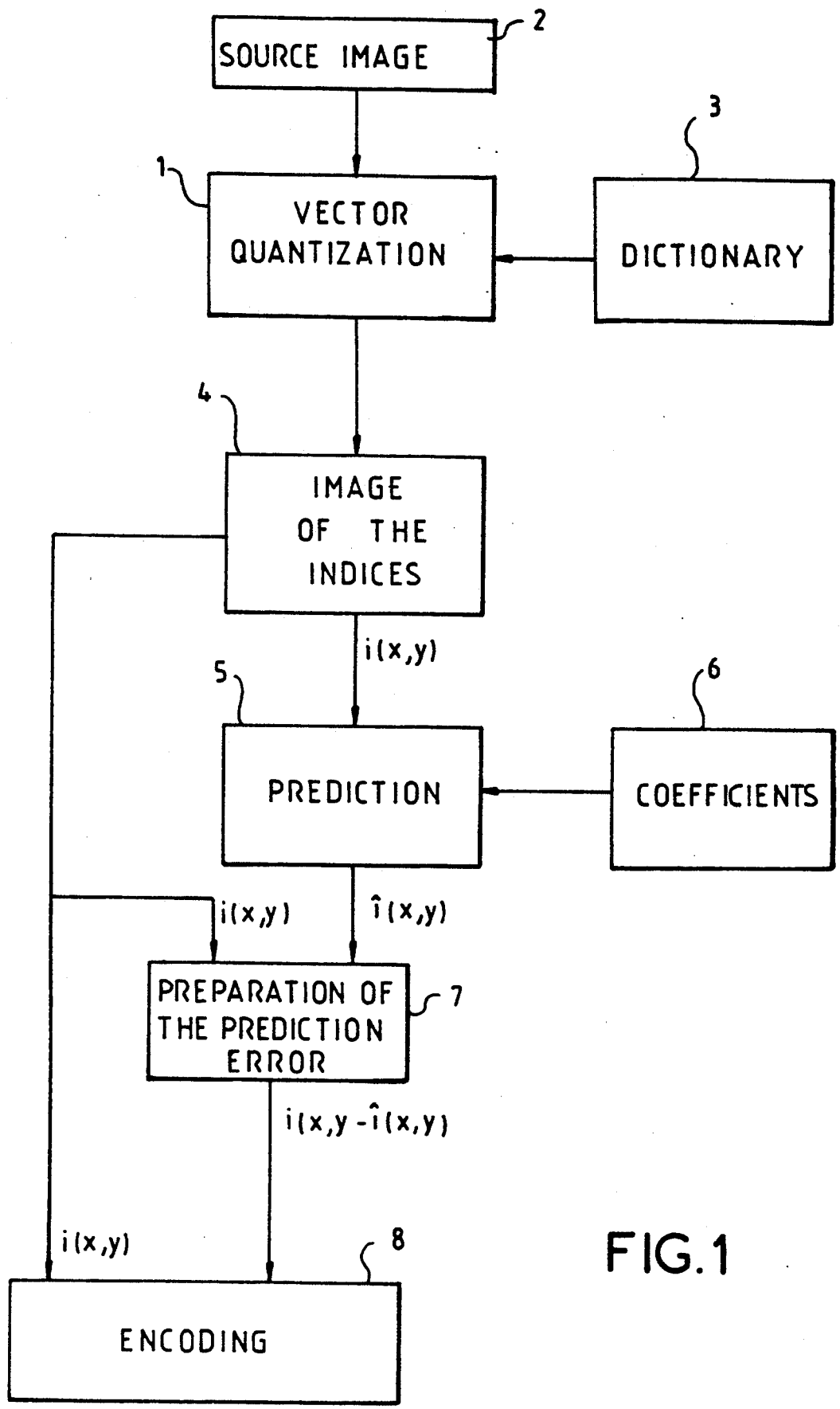
FIG. 1 is a flow chart showing the compression of images according to the invention.

FIG. 1 shows a flow chart of the compression of images according to the invention. In a first vector quantization step 1, the source image 2 is cut up into blocks, each block is compared with the elements of the dictionary 3 closest to it. The compressed image is obtained when each of the blocks of the source image have been replaced by an index. This image is the image of the indices 4.

Figure 2:
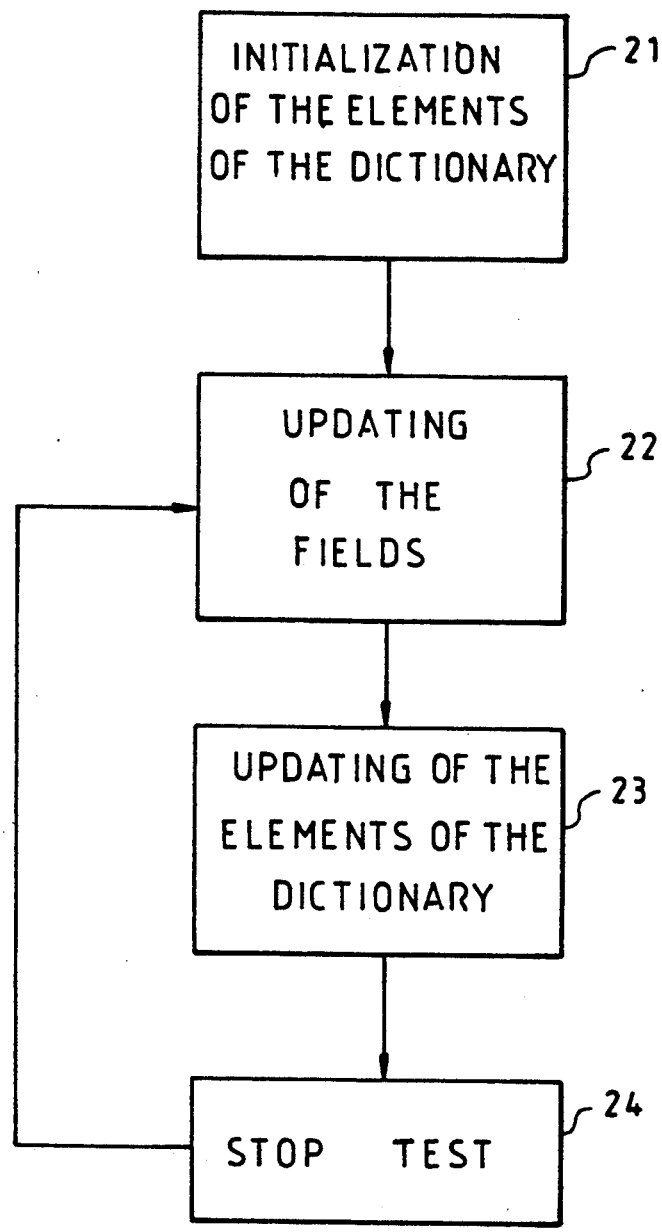
FIG. 2 is an illustration of the algorithm for the construction of a dictionary of blocks of pixels improving the performance characteristics of the method according to the invention.
Figure 3A:
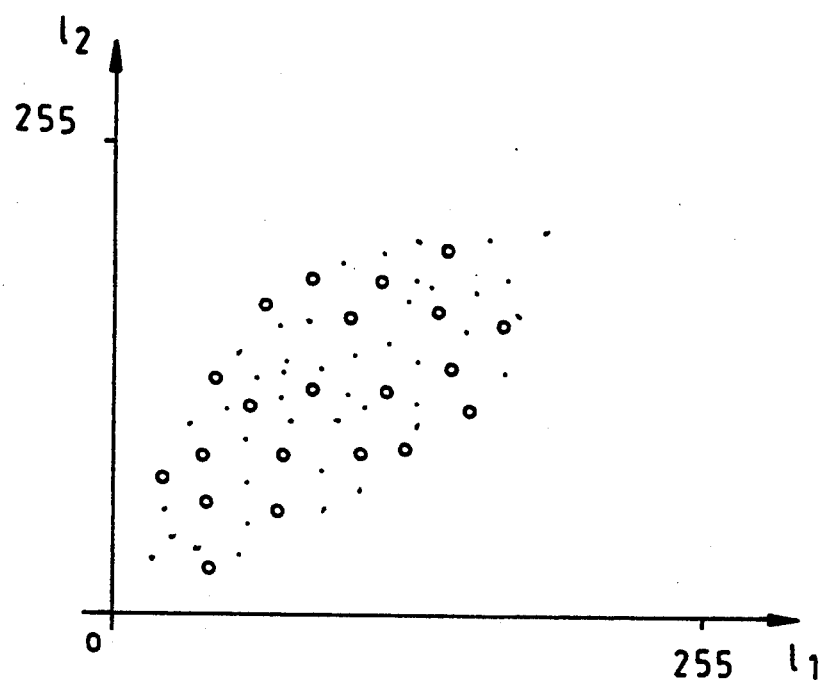
FIG. 3a is an illustration of the blocks of the dictionary used by the invention and of the blocks coming from a learning set.
Figure 3B:
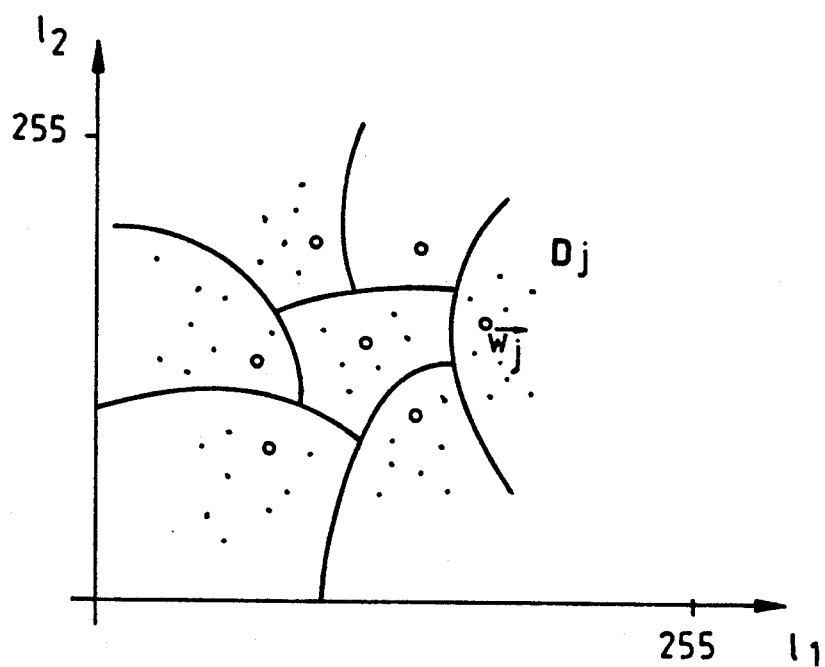
FIG. 3b is an illustration of the fields associated with each of the blocks of the dictionary used by the invention.

The method according to the invention uses a method of vector quantization that preserves a coherence for the image of the indexes 4 as compared with the source image 2 so that this image of the indexes 4 can be used as the input for a second compression step 5 which, according to the invention, uses a method of prediction. In this respect and in order to improve the prediction, the method, in the first step 1, uses a dictionary 3 constructed according to the algorithm illustrated in FIG. 2. The algorithm starts with a first step for the initialization of the elements of the dictionary 21. These elements are randomly chosen blocks and are represented by vectors. The dictionary 3 may contain, for example, M elements referenced $\vec{W}_j$ where j is a subscript belonging to the integers from 0 up to and including M−1. j represents the index of the block represented by the vector $\vec{W}_j$. This block is called the index i block. The components of the vector $\vec{W}_j$ are the luminance values of the pixels of the index j block. These luminance values are, for example, encoded on eight bits and have values ranging from 0 to 255. FIG. 3a shows the projection of the geometrical locus of the vectors $\vec{W}_j$ along two components associated with two successive pixels taken two by two in the direction of the scanning of the source image 2. The circles represent the vectors $\vec{W}_j$ associated with the blocks of the dictionary and the dots represent the blocks of the image. These blocks are extracted from a learning set containing a large number of blocks extracted from one or more images, are very numerous and are extracted from one or more images. The axes $|_1$ and $|_2$ indicate the luminance values of the two successive pixels encoded between 0 and 255. Each vector $\vec{W}_j$ generates a field $D_j$ comprising vectors $\vec{x}$ representing blocks of the above-mentioned learning set. FIG. 3b shows the fields $D_j$ associated with the vectors $W_j$. These fields are separated by solid lines. A law of initialization of the blocks of the dictionary 3 may, for example, define the vectors $\vec{W}_j$ by $$W_{ij} = j/2ns + b$$

where $W_{ij}$ is the $i^{th}$ order component of the vector $\vec{W}_j$, $ns$ is an integer chosen for example such that $2^{ns}$ is equal to the number of gray levels of the source image and $b_{ij}$ is a noise of uniform density with a value ranging for example from −5 to 5.

The step 21 is followed by a step 22 for the updating of the above-mentioned fields. A field $D_k$ associated with the vector $\vec{W}_k$ representing a block of the dictionary 3 with an index k is updated as follows according to the above-mentioned k-means algorithm: each new vector $\vec{x}$ belonging to $D_k$ is determined by the relationship:

$$\sum_{l=0}^{l=M-1} a_{kl}\|\vec{x}-\vec{W_l}\|^2 \leq \sum_{l=0}^{M-1} a_{jl}\|\vec{x}-\vec{W_l}\|^2$$

whatever may be the index j different from the index k.

The coefficients $a_{kl}$, $a_{jl}$, relating respectively to the fields $D_k$ and $D_j$, express the topological interactions inside the dictionary. A coefficient $a_{jk}$ expressing the interactions between the field Dj and the field Dk is, for example, defined at the iteration t by:

$$a_{jk(t)} = e^{-(j-k)2/\sigma t^2} \text{ avec } \sigma_t = \sigma_1\left(\frac{\sigma_T}{\sigma_1}\right)^{t/T}$$

T being the total number of iterations defined beforehand. $\sigma_1$ corresponds to the first iteration; it may, for example, take a value ranging from 1 to 10. $\sigma_T$ corresponds to the second iteration; it may, for example, take a value ranging from 0.1 to 1.

The step 22 is followed by a step 23 for the updating of the elements of the dictionary. A vector $\vec{W_j}$ representing an index j block of the dictionary is updated by the relationship:

$$\vec{W_j} = \frac{\sum_{k=0}^{k=M-1} a_{jk} \, p_k \, \vec{b_k}}{\sum_{k=0}^{k=M-1} a_{jk} \, p_k}$$

ajk is the previously defined coefficient.

$p_k$ is the probability that a block of the learning set will have its associated vector $\vec{x}$ that belongs to a previously defined field Dk.

$\vec{b_k}$ is a vector, the end of which represents the barycenter of the ends of the vectors of the field Dk.

The step 23 is followed by a stopping test step. If the number of iterations already performed is equal to the total number T allowed, the construction of the dictionary 3 is completed. If not, the step 24 is again followed by the step 22 for the updating of the fields. The total number T of iterations is, for example, equal to some hundreds and makes it possible to obtain satisfactory results. The algorithm for the constitution of the dictionary 3 according to the invention amounts in fact to making successive updatings of the fields and of the elements of the dictionary. This algorithm makes it possible, advantageously, to converge towards an improved definition of the dictionary. Furthermore, the contents of the blocks with indices that are close to each other in the dictionary are almost similar. This preserving of the topology makes it possible to preserve a coherence of the image of the indices 4 in relation to the source image 2 and permits the implementation of the second step of the method according to the invention for the compression of the image of the indices 4 according to another method of prediction as can be seen in FIG. 1. The prediction operator may be, for example, a network of multilayer neurons. A learning algorithm can be used to obtain the coefficients 6 of this network. To predict the value of the index i (X, y) located in the compressed image at the column x and at the row y, the prediction network 5 receives, at input, a vector prepared out of four neighboring pixels in the compressed image, the indices of which are i(x−1, y−1), i(x, y−1), i(x+1, y−1) and i(x−1, y). The prediction of i(x, y) obtained at output of the second step 5 is referenced î(x, y). So as not to induce any loss of quality, the prediction errors i(x, Y)−î(x, y) are transmitted with the corresponding index i(x, y) to an encoder 8 after an error preparation step 7. The prediction error may be, for example, encoded according to a HUFFMAN code presented in the work by Georges CULLAMNN, *Codage et Transmission de l'Information* (Information Coding And Transmission), pp. 87–88, Eyrolles, 1968.

The new compressed and encoded image can thus be stored in a mass memory or transmitted for example, this being achieved with an excellent compression rate for a satisfactory quality of the reconstituted image.

What is claimed is:

1. A method for transmitting or storing a source image, said method using vector quantization, a prediction network, and an encoder to compress the source image, said method comprising the steps of
   (a) dividing the source image into blocks of pixels,
   (b) comparing each block with a plurality of vectors stored in a dictionary, each vector having an index,
   (c) replacing each block of the source image with an index of the vector in the dictionary that is closest to the block of the image to obtain a compressed image, wherein blocks from the source image with similar content are replaced by indices located close to one another in the dictionary so that the compressed image is coherent with respect to the source image, and wherein i(x,y) is the index located at column x and row y of the compressed image,
   (d) using a prediction network, generating a prediction î(x,y) for each index i(x,y) by receiving at an input of the prediction network a vector comprised of indices in the compressed image which are neighbors of i(x,y),
   (e) transmitting a prediction error of each index, i(x,y)−î(x,y), to an encoder,
   (f) at the encoder, encoding the prediction errors to generate encoded data, and
   (g) transmitting the encoded data via transmission means or storing the encoded data in storage means.

2. The method of claim 1 wherein said prediction network comprises a plurality of multi-layer neurons.

3. The method of claim 1 wherein said prediction errors are encoded by said encoder using a Huffman code.

* * * * *